United States Patent [19]

Baumler

[11] Patent Number: 4,549,246

[45] Date of Patent: Oct. 22, 1985

[54] AIR DIELECTRIC VARIABLE CAPACITOR UTILIZING A STATOR FORMED AS PART OF THE CIRCUIT LAYOUT ON THE SUBSTRATE

[75] Inventor: Robert J. Baumler, Waseca, Minn.

[73] Assignee: E. F. Johnson Company, Waseca, Minn.

[21] Appl. No.: 626,671

[22] Filed: Jul. 2, 1984

[51] Int. Cl.[4] .............................................. H01G 5/06
[52] U.S. Cl. ................................................... 361/293
[58] Field of Search ............... 361/277, 287, 290–293, 361/298, 299

[56] References Cited

U.S. PATENT DOCUMENTS

| | | | |
|---|---|---|---|
| 1,240,958 | 9/1917 | Donle | 361/291 |
| 1,589,204 | 6/1926 | Miller et al. | 361/291 |
| 1,712,097 | 5/1929 | Van Deventer | 361/291 |
| 1,717,912 | 6/1929 | Brockway | 361/291 |
| 2,205,203 | 6/1940 | Johnson et al. | 175/41.5 |
| 3,530,411 | 9/1970 | Sear | 361/287 |
| 3,633,079 | 1/1972 | Watson | 361/307 X |
| 3,633,080 | 1/1972 | Watson | 361/307 X |
| 3,701,932 | 10/1972 | Johanson | 361/293 |
| 3,757,177 | 9/1973 | Buehler | 361/321 |
| 4,004,200 | 1/1977 | Johanson | 339/275 B X |
| 4,095,263 | 6/1978 | Johanson | 361/292 |
| 4,112,480 | 9/1978 | Johanson et al. | 361/271 |
| 4,179,722 | 12/1979 | Johanson et al. | 361/293 |
| 4,242,716 | 12/1980 | Johanson et al. | 361/299 |
| 4,283,751 | 8/1981 | Tatsumi | 361/293 |
| 4,369,483 | 1/1983 | Shirakawa | 361/290 |

FOREIGN PATENT DOCUMENTS 194914 12/1977 Fed. Rep. of Germany .

Primary Examiner—Donald A. Griffin
Attorney, Agent, or Firm—Dorsey & Whitney

[57] ABSTRACT

A new low profile miniaturized air dielectric variable capacitor for use in hybrid circuits. A very cost effective, low priced variable capacitor that combines precision with a low profile is disclosed for use in hybrid circuits and other applications where space requirements are tight. The new capacitor uses a unique design to achieve an extremely low profile, less than 0.127 inches, for varying capacitive ranges. The new design is achieved by creating the stator as part of the circuit layout or design. The stator is actually formed on the surface of the substrate by a thick film metallization or by copper etching and one or many capacitors can be formed as part of the circuit layout. Thereafter, a metallic conductive housing, internally threaded, is positioned over the stator. Internal to the housing is an externally threaded rotor having an adjusting knob or screw extending through the housing. With a thread density of one hundred twenty-eight turns per inch on the housing and the rotor, four complete revolutions can be achieved for purposes of adjustability of the capacitance. With housings of diameters varying between less than a quarter of an inch to a half inch tunable capacitive ranges can be achieved between one and nine picofarads.

Because the design of the capacitor is leadless extremely high frequencies can be utilized up to those in the gigahertz range.

16 Claims, 18 Drawing Figures

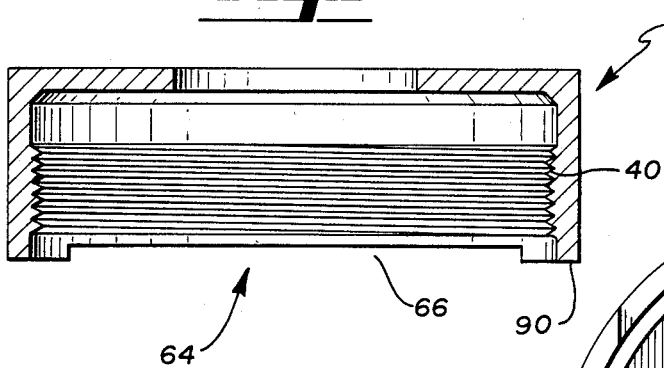
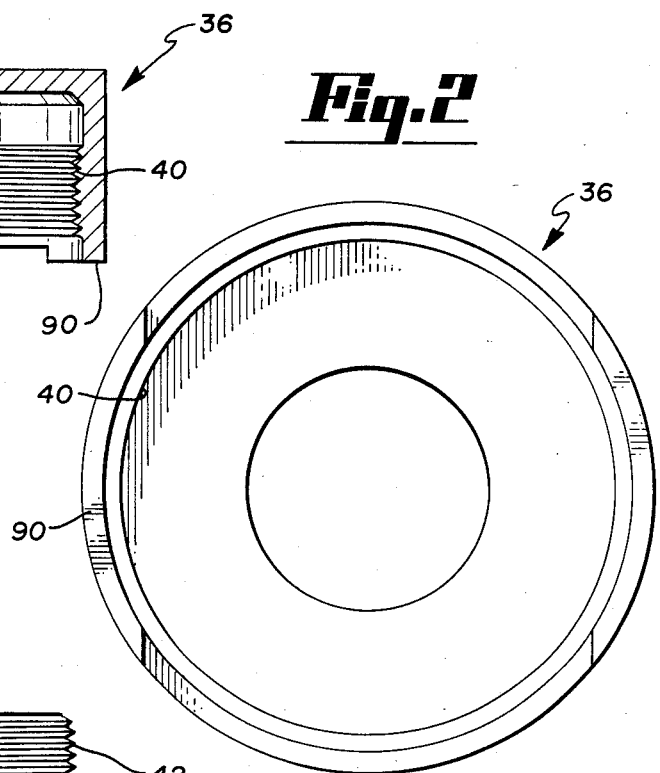
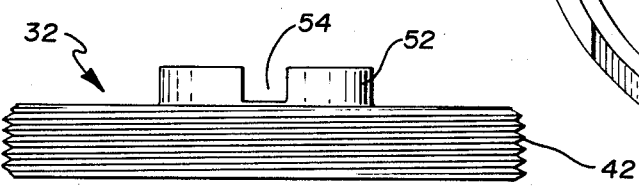
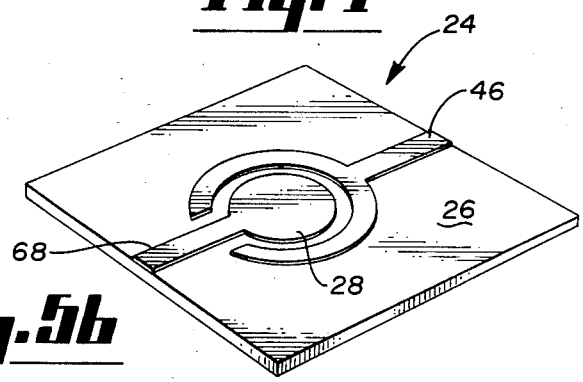
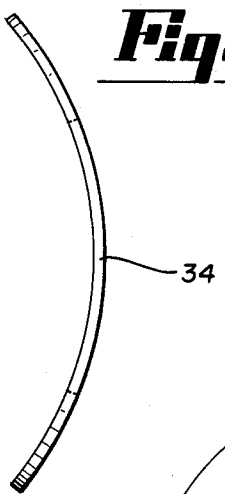
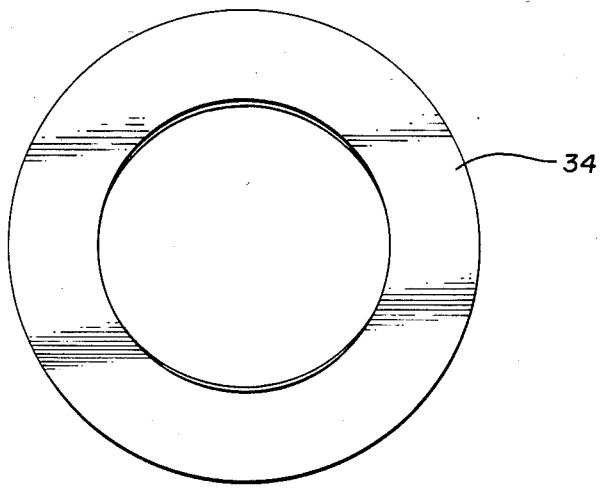

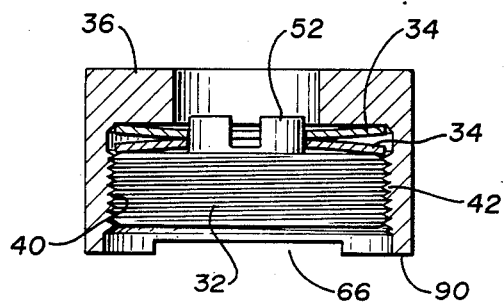
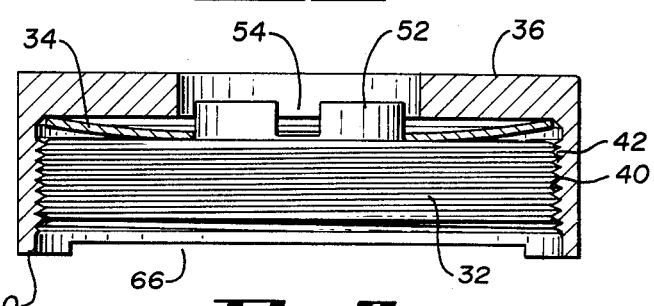
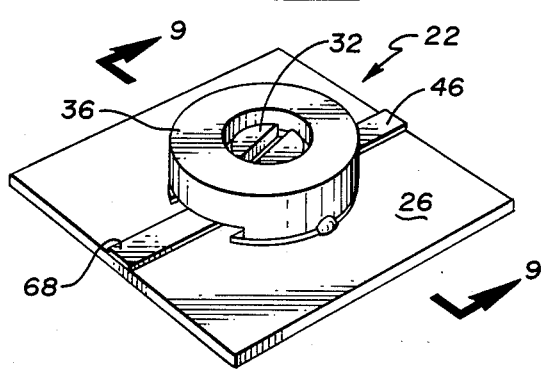
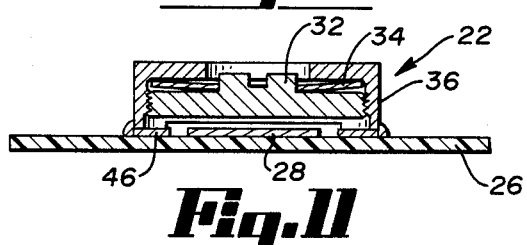
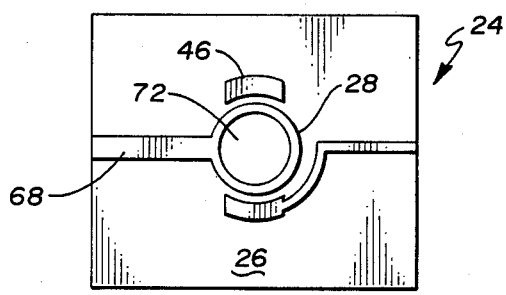
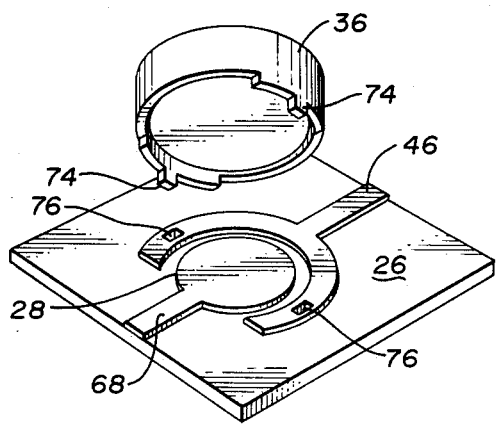
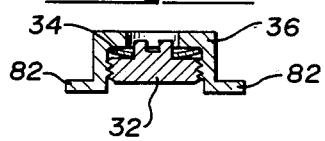
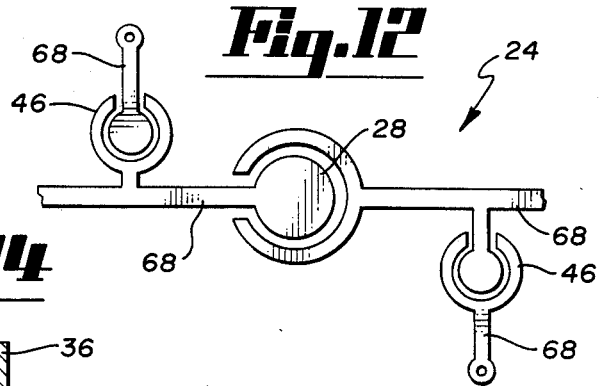
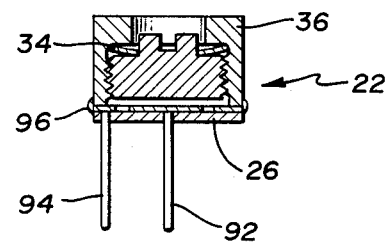

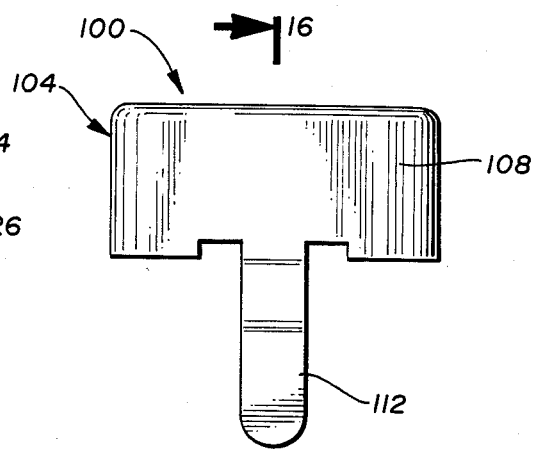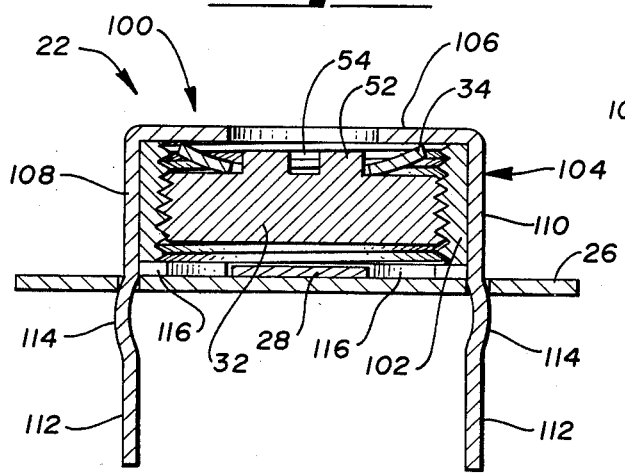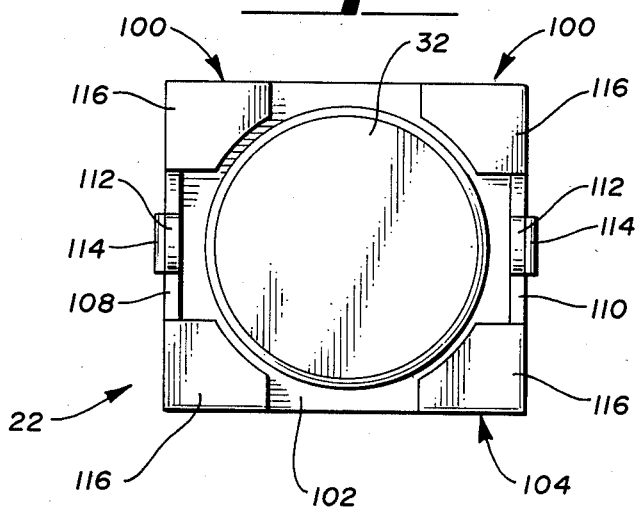

AIR DIELECTRIC VARIABLE CAPACITOR UTILIZING A STATOR FORMED AS PART OF THE CIRCUIT LAYOUT ON THE SUBSTRATE

BACKGROUND OF THE INVENTION

FIELD OF THE INVENTION

The invention relates to air dielectric variable capacitors, and particularly to miniaturized air dielectric variable capacitors such as those that are used as components in hybrid circuit arrangements mounted on a substrate.

More and more electronic functions have been achieved with the use of integrated circuits, large scale integrated circuits, and other forms of microelectronics. Hybrid circuits have also been in common use today which consist of a combination of integrated circuits with discrete components such as capacitors. Miniaturization of such capacitors has been attempted in the past using a variety of design techniques and approaches.

The majority of the prior art attempts use a dielectric other than air and employ a rotor system wherein the capacitance changes as various shaped rotors are turned by a screwdriver. Similar attempts have been made to change the shape of a plate used as a rotor. Other designs in common use in the past have been capacitors comprising layers of dielectric metal sandwiched together as well as small tubular air or sapphire dielectric variable capacitors.

With the continuing miniaturization of circuit design, including those used in hybrid circuits, there is a continuing need for miniaturization of discrete capacitors, preferably of high precision and low cost.

SUMMARY OF THE PRESENT INVENTION

The present invention meets the need of a low cost, high precision, miniaturized capacitor of small diameter and low profile, yet providing precision comparable to small tubular air dielectric variable capacitors or sapphire dielectric variable capacitors but can be achieved at a cost which is on the order of four to six times less than tubular air or sapphire dielectric variable capacitors.

The invention is achieved with a minimum of parts which can be easily machined out of common rod stock. The low profile is attained by providing above the substrate only the rotor and the adjustment mechanism, all of which are housed in a conductive housing which is positioned over a stator which is part of the circuit layout created by the circuit designed and which is added to the circuit layout by conventional technique, such as thick film metallization or copper etching and the like.

Because the circuit designer actually designs the capacitor into the circuit layout he can also control the precision of the capacitor as well as the capacitance that will be created by the resulting structure. A large diameter stator will provide the full range of capacitance for any diameter housing which is chosen. By reducing the diameter of the stator and using the same housing the capacitance of the capacitor is reduced. It will be appreciated that the precision of the capacitor will be somewhat reduced as the diameter of the stator is reduced. The full range of travel of the rotor (preferably four full revolutions) can be utilized, however, thereby enhancing overall precision. The rotor is mounted in the housing and engages the housing with threads at a thread density which is preferably on the order of one hundred twenty-eight turns per inch.

Since the stator is actually formed on the substrate itself and soldered to the circuit layout, the resulting capacitor is leadless and can be used at higher frequencies, up to four to five gigahertz depending on the capacitance.

The resulting structure is an extremely cost effective, low profile, miniaturized substrate mountable air dielectric variable capacitor which yields relatively high precision yet can be flexibly utilized to create different capacitive ranges depending on the design layout of the circuit designer who actually creates the stator on the circuit board he is designing.

These and other advantages and objectives of the invention will become apparent to one skilled in the art upon a review of the detailed description given below, the drawings, and the claims appended hereto.

DESCRIPTION OF THE DRAWINGS

FIG. 1 is a cross section of the housing for the capacitor;

FIG. 2 is a bottom view of the housing;

FIG. 3 is an end view of the rotor which is threaded into the housing;

FIG. 4 shows a simple design of the substrate with the stator and stator lead as well as the rotor lead which is electrically connected to the rotor through the housing of the capacitor. FIGS. 5a and 5b show the spring means which are used to establish electrical contact between the rotor and the housing as well as to stabilize the capacitor at the capacitance by the user; FIG. 5a shows a cross section of the spring showing the curvature; FIG. 5b shows a top view thereof;

FIG. 6 shows a cross section of a capacitor using two of the springs of FIG. 5;

FIG. 7 shows a cross section of a capacitor using one of the springs of FIG. 5;

FIG. 8 is a perspective view of the assembled capacitor as mounted and soldered onto the substrate demonstrating the ease of assembly and low profile of the capacitor when in place;

FIG. 9 is a cross section of the capacitor of FIG. 8 taken along the lines 9—9 of FIG. 8;

FIG. 10 shows a circuit board layout similar to that of FIG. 4 except that in FIG. 10 an alumina ceramic layer has been applied over the stator to prevent the rotor from shorting out to the stator. In addition, only those portions of the rotor lead which actually contact the housing have been provided;

FIG. 11 shows another embodiment of the housing and substrate layout wherein feet have been provided on the housing which can be inserted through apertures in the substrate used to precisely align and locate the capacitor on the circuit board;

FIG. 12 shows how a circuit designer can use the invention and design circuits having capacitors which are connected in series or in parallel;

FIG. 13 shows a variation of the housing wherein a flange has been provided to assure contact between the rotor leads and the housing;

FIG. 14 shows another embodiment of the invention which can be mounted in either vertical or horizontal relationship to a substrate wherein the invention is packaged and a substrate is provided internal to the capacitor housing to provide a similarly high precision, inexpensive air dielectric variable capacitor of the present invention;

FIG. 15 is a side elevational view of yet another embodiment of the invention;

FIG. 16 is a sectional view taken along line 16—16 of FIG. 15; and

FIG. 17 is a bottom view of the capacitor depicted in FIG. 15 and 16.

DESCRIPTION OF THE PREFERRED EMBODIMENT

Component capacitors used in hybrid circuits conventionally employ a rotor and stator of varying designs separated by a dielectric, sometime air. If the capacitor is variable, some means are provided to change the rotor position or shape relative to the stator so that adjustment to the capacitor changes the capacitance. These designs have been conventionally packaged and adapted to be soldered to a hybrid circuit board with the use of holes drilled in the circuit board at the appropriate capacitor position.

The increased miniaturization of hybrid and other microelectronic circuits places a high premium on space, size and the density of components. The increasingly high frequency response required of electronic circuitry further requires designs which are frequency and temperature insensitive and as the density of components increases to achieve the smaller sizes desired more and more flexibility must be given to the designer of the circuit board to achieve the objectives of reduced size. The substrate mountable air dielectric variable capacitor 22 disclosed herein addresses each of these concerns of the circuit designer and provides a high precision miniaturized, low provile variable capacitor 22 with a capacitance that is actually determined by the circuit layout (such as shown in FIG. 12) of the circuit designer and which is variable to yield the precise capacitance desired by the designer.

This is achieved with a capacitor 22 construction which is extremely economic. The capacitor 22 design utilizes the circuit layout 24 on the substrate board 26. The stator 28 for the capacitor 22 is formed on and as part of the substrate 26. As described in more detail below it is laid out on the board 26 by conventional techniques such as thick film metallization or copper etching and can be precisely positioned and dimensioned as part of the circuit layout.

As shown in FIGS. 6, 7 and 10 a rotor 32 biased by a spring 34 in a housing 36 is provided which is positioned over the stator 28 and soldered into place to provide the capacitor 22 of the instant invention.

The housing 36 and the rotor 32 can be conveniently machined from rod stock. The metal housing 36 is internally threaded with fine threads 40 to achieve high tuning resolution. The rotor 32 is similarly threaded, 42. A thread 40, 42 density is preferably used on the order of one hundred and twenty-eight turns per inch. This provides four full revolutions from one end of the capacitive range to the other.

Either one or more washer springs 34 such as shown in FIGS. 6 and 7 or a coil spring is inserted in the housing 36 between the top of the housing 36 and the rotor 32 to bias the rotor 32 towards the stator 28 and to assure continuous solid contact between the rotor 32 and the body 36 for purposes of stability of capacitance and for good electrical contact between the rotor 32 and the rotor lead 46 formed in the substrate 26. A flat disc-shaped rotor 32, as shown in FIG. 3, is preferably used with a medium diameter stem 52, the rotor being externally threaded and screwed into the housing 36 against the spring 34 tension. A screwdriver slot 54 or other adjustment mechanism is preferably provided at the end of the stem 52.

The open end 64 of the housing 36 is notched with clearance slots 66 to allow clearance for a circuit path 68 to the stator 28 and for cleanout after wave soldering. This prevents flux contaminants from remaining in the capacitor housing 36.

The stator 28 of the capacitor 22 is fabricated on the circuit board or substrate 68 by either thick film metallization or copper etching as shown in FIGS. 4, 8 and 10–12. As shown in FIG. 10 an insulating material 72 may also be provided on top of the stator metallization 28 to prevent the stator 28 from shorting to the rotor 32. The insulating material 72 could also be put on the surface of the rotor 32.

The housing assembly 36 is then positioned directly over the stator metallization 28 and soldered or attached with conductive epoxy to the rotor connection leads 46, preferably in at least two places as shown in FIGS. 8 and 9.

Changes in capacitance are achieved by the change in the air gap between the rotor 32 and the stator 28 as the rotor 32 is rotated. Using rotors 32 having diameters of 0.187, 0.344 and 0.469 inches provides capacitive ranges of 1 to 3, 2 to 5 and 3 to 9 pF, respectively, have been achieved.

The circuit designer, to use the substrate mountable air dielectric variable capacitor 22 designs the stator 28 size and position when he is screen printing or etching his circuit 24.

Shown in FIG. 12 is a circuit design using three capacitors 22 which might be used in a circuit layout 24.

To reduce capacity, or to decrease resolution, the diameter of the stator 28 pattern can be reduced. For example, the capacitor resulting from the layout shown at the left of FIG. 12 will have a lower capacitance and lower resolution than the capacitor resulting from the layout shown at the middle of FIG. 12. This provides increased flexibility in product design because instead of maintaining an inventory of thirty or forty different capacitor sizes only two or three capacitor housing sizes are necessary with variations in capacitance dependent upon the diameter of the stator 28 as designed in the circuit layout 24.

FIGS. 4 and 10 show variations in the layout of the stator 28. As shown in FIG. 4, the stator 28 is applied to the substrate 26, either by thick film metallization or copper etching. A terminal lead 68 is provided from the stator 28 to a circuit connection point.

Surrounding the stator 28 is the rotor lead 46 which is also applied by thick film metallization or by copper etching and is adapted to be connected to the conductive housing 36. A similar lead 46 to a circuit connection point is provided from the rotor 32.

The housing 36 is then fastened to the rotor lead 46 with solder, conductive epoxy or the like as shown in FIG. 8.

Changing the rotor metallization area on the substrate will also affect capacitance. For example, FIG. 10 will have lower capacitance than FIG. 4 if both have the same stator diameter because FIG. 10 has less rotor metallization area.

To provide a stop 72 for the capacitor 22 so that the rotor 32 does not short to the stator 28, an alumina ceramic dielectric paste can be applied to the stator 28 and fired. Similarly, dielectric insulation may be put on the rotor. It is also possible, as shown in FIG. 10, to either further insulate the rotor leads 46 or to provide only that portion of the rotor leads 46 necessary to make a circuit connection and to solder the housing 36 to the board. This provides an extremely efficient design wherein the plates of the capacitor 22 can be adjusted to within a few thousandths of an inch for high capacity without shorting the plates 28, 32 of the capacitor 22.

Precision of location of the housing 36 relative to the stator 28 may be achieved with the use of feet 74 added to the housing 36 such as shown in FIG. 11. Precisely positioned apertures 76 can be provided in the circuit board 28 so tht the capacitor 22 can be precisely located and bonded to the circuit board during assembly.

Other alternative expedients used in the design of the capacitor 22 of the instant invention include modifications such as shown in FIGS. 13 and 8.

In FIG. 13 a flange 82 is provided around the bottom 61 of the housing 36. In certain applications this can improve performance because of the better mounting surface, i.e. more surface area 82 is in contact with the lead 46 on the PC board 26. Utilizing only the housing 36 as shown in FIG. 9 the bonding area 90 between the housing 36 and the rotor lead 46 is on the order of ten thousandths of an inch wide. The flange 82 shown in FIG. 13 provides a better bond between the unit 32, 34, 36 and the mounting surface 46 so that the capacitor 22 is less sensitive to temperature coefficients and therefore does not tend to expand and contract as easily as a housing 36 without such a flange 13.

Because the capacitor 22 is leadless, it can be used at higher frequencies, up to 4 to 5 GHZ, depending on capacitance. With the stator fabricated on a typical ceramic substrate (alumina), the capacitor 22 exhibits a Q or more than two thousand when measured at one MHz and when a working voltage of 100 V dc is used.

A similar construction is depicted in FIG. 14 wherein a ceramic substrate 26 is provided in a packaged capacitor using the same basic design as described above. Using this design the capacitor 22 can be applied to circuit pin locations in the pc board using either a horizontal or a vertical orientation. In particular, a stator pin 92 is electrically connected to stator 28 and a rotor pin 94 is electrically coupled to the rotor 32 by connection to rotor lead 46. Substrate 26 is mechanically coupled to housing 36 by weld or solder bead 96. While the use of such a packaged component will add to the profile of the capacitor 22, the same advantages in precision and in cost of the construction are realized.

A final alternative embodiment of the capacitor 22 in accordance with the present invention is depicted in FIGS. 15, 16 and 17. The capacitor 22 of FIGS. 15-17 includes a rotor and board mounted stator similar to that described above, and like component parts are indicated by similar numbers.

The housing 100 of the final embodiment includes internally threaded portion 102 and casing 104. Casing 104 includes generally square, apertured top wall 106, and opposed side walls 108, 110. An elongated, downwardly extendng mounting tab 112 depends from each side wall 108, 110. Each tab 112 may include a formed locking portion 114. A pair of opposed retaining tabs 116 also depend downwardly from each side wall 108, 110. As best depicted in FIG. 17, retaining tabs 116 may be bent inwardly to retain threaded portion 102 within casing 104. The tabs 116 provide a mounting surface for supporting the casing 104 on board 26. Electrical connection to the rotor can be made through the housing 100 by attachment of lead wires to tabs 112. Alternatively, copper etching or thick film metallization pads may be provided on substrate 26 for engagement with tabs 116.

Having thus described my invention it will be obvious to those skilled in the art that certain variations can be made such as variations to the housing and the like. Each such modification and variation is intended to be within the scope and intendment of the appended claims.

I claim:

1. In an air variable capacitor having a conductive housing and a longitudinally adjustable rotor for use in a circuit layout formed on the surface of the substrate of a circuit board, the improvement comprising:
    a stator formed as part of the circuit layout and positioned relative to the rotor to develop a capacitance therebetween, the stator being formed on the substrate as part of the circuit layout; and
    means for electrically contacting the rotor through the conductive housing of the capacitor.

2. An air variable capacitor mountable upon a circuit board substrate having a circuit layout formed thereon comprising:
    a housing that is threaded internally;
    a rotor, threaded on its periphery, that rides longitudinally in said housing, and a portion of which extends through said housing for longitudinal adjustment in said housing;
    a spring means which stabilizes the rotor and assures continuous contact between the externally threaded rotor and the internally threaded housing, said spring being disposed between the housing cover and the rotor and biasing said rotor toward the stator; and
    a stator formed on said substrate as part of the circuit layout.

3. A substrate mountable air variable capacitor for use with a substrate having a stator formed thereon, the capacitor comprising:
    an internally threaded housing concentrically aligned with the stator formed on the substrate;
    an externally threaded rotor mounted in the housing and concentrically aligned above but spaced from the stator formed on the substrate;
    means for adjusting the rotor relative to the stator, said means comprising a stem extending from the rotor through the housing;
    spring means for biasing the rotor towards the stator and for assuring continuous contact between the externally threaded rotor and internally threaded housing; and
    means for fixedly securing the housing to the substrate so that the rotor is concentrically aligned with the stator.

4. The capacitor of claims 1, 2 or 3 further comprising:
    means for electrically contacting the stator and the rotor so that a capacitance can be established therebetween.

5. The capacitor of claims 1, 2 or 3 further comprising:
    stator leads formed on the surface of the substrate for electrically contacting the stator;
    rotor leads formed on the surface of the substrate for electrically contacting the housing; and
    means for securing the housing to the rotor leads.

6. The capacitor of claims 1, 2 or 3 wherein the rotor leads are formed on the substrate surrounding the stator and wherein the housing further comprises a conductive flange extending around the periphery of the housing which is conductively secured to the rotor lead.

7. The capacitor of claims 1, 2 or 3 wherein at least one circuit connection is formed on the substrate to the stator and wherein the housing further comprises at least one aperture to separate and insulate the housing from the stator lead.

8. The capacitor of claims 1, 2 or 3 wherein at least one aperture is provided in the housing so that contaminants can be removed from the capacitor.

9. The capacitor of claims 1, 2 or 3 wherein slots are provided in the substrate for positioning of the capacitor and wherein the housing further comprises feet which fit in the slots to precisely locate the housing and rotor over the stator.

10. The capacitor of claims 1, 2 or 3 wherein the capacitor further comprises a dielectric layer formed on the stator or rotor to prevent the rotor from contacting the stator.

11. The capacitor of claim 10 wherein the layer is formed of a ceramic insulation material.

12. The capacitor of claims 1, 2 or 3 wherein the diameter of the stator formed on the substrate is variable so that the circuit designer can vary the capacitance of the capacitor by varying the diameter of the stator.

13. The capacitor of claims 1, 2 or 3 wherein the substrate has a greater diameter than the stator and a lesser diameter than the outer diameter of the housing and wherein the housing extends around the substrate thereby containing the substrate within the housing and wherein the capacitor further comprises a first pin extending through the substrate and contacting the stator and a second pin contacting the housing.

14. The capacitor of claim 13 wherein both pins are oriented longitudinally relative to the capacitor so that when installed the capacitor has a vertical orientation relative to the circuit board.

15. The capacitor of claim 3 including an external casing, said housing received within said casing, said securing means comprising mounting tabs depending from said casing and receivable through said substrate.

16. A substrate mountable air variable capacitor comprising:
- a substrate having a circuit layout formed thereon;
- a stator formed on the substrate as part of the circuit layout;
- stator leads formed on the substrate interconnecting the stator and other circuit parameters;
- rotor leads formed on the substrate as part of the circuit layout interconnecting the rotor and other circuit parameters;
- a housing longitudinally aligned with the stator and positioned above the stator to house the air variable capacitor;
- a plurality of threads formed on the internal sidewall of the housing;
- a rotor mounted in the housing having threads formed on the outer periphery thereof for engaging the threads and the internal sidewall of the housing;
- said rotor having a stem extending through the aperture in the housing for adjusting the position of the rotor and therefore the capacitance of the capacitor; and
- spring means interposed between the housing and the rotor for assuring continuous electrical contact between the threaded rotor and the internally threaded housing and for stabilizing the position of the rotor relative to the housing and the stator.

* * * * *